United States Patent
Takahashi et al.

(10) Patent No.: US 10,431,472 B2
(45) Date of Patent: Oct. 1, 2019

(54) GAS COMPOSITION FOR DRY ETCHING AND DRY ETCHING METHOD

(71) Applicant: Kanto Denka Kogyo Co., Ltd., Tokyo (JP)

(72) Inventors: Yoshinao Takahashi, Gunma (JP); Korehito Kato, Gunma (JP); Tetsuya Fukasawa, Gunma (JP); Yoshihiko Iketani, Gunma (JP)

(73) Assignee: KANTO DENKA KOGYO CO., LTD., Tokyo (JP)

( * ) Notice: Subject to any disclaimer, the term of this patent is extended or adjusted under 35 U.S.C. 154(b) by 0 days.

(21) Appl. No.: 16/167,104

(22) Filed: Oct. 22, 2018

(65) Prior Publication Data

US 2019/0057878 A1 Feb. 21, 2019

Related U.S. Application Data

(62) Division of application No. 15/292,307, filed on Oct. 13, 2016.

(51) Int. Cl.
*H01L 21/311* (2006.01)
*H01L 21/02* (2006.01)
*C09K 13/00* (2006.01)

(52) U.S. Cl.
CPC ........ *H01L 21/31116* (2013.01); *C09K 13/00* (2013.01); *H01L 21/02527* (2013.01); *H01L 21/02532* (2013.01); *H01L 21/31144* (2013.01)

(58) Field of Classification Search
CPC .................................................. H01L 21/31116
USPC ......................................................... 438/719
See application file for complete search history.

(56) References Cited

U.S. PATENT DOCUMENTS

| | | | |
|---|---|---|---|
| 2,743,303 | A | 4/1956 | Anderson |
| 2008/0274334 | A1 | 11/2008 | Sekiya et al. |
| 2014/0306146 | A1 | 10/2014 | Ito et al. |
| 2015/0357200 | A1 | 12/2015 | Inui |

FOREIGN PATENT DOCUMENTS

| | | |
|---|---|---|
| JP | H02-250987 A | 10/1990 |
| JP | 2002-016050 A | 1/2002 |
| JP | 2011-086966 A | 4/2011 |
| JP | 2014-041849 A | 3/2014 |
| JP | 2008300616 A | 12/2018 |
| WO | 2014-104290 A1 | 7/2014 |

*Primary Examiner* — Roberts P Culbert
(74) *Attorney, Agent, or Firm* — Young & Thompson

(57) ABSTRACT

A silicon oxide film or a silicon nitride film is selectively etched by using an etching gas composition including a hydrofluorocarbon that has an unsaturated bond in its molecule and is represented by CxHyFz, wherein x is an integer of from 3 to 5, and relationships y+z≤2x and y≤z are satisfied. Also, a silicon oxide film is etched with high selectivity relative to a silicon nitride film by controlling the ratio among the hydrofluorocarbon, oxygen, argon, etc., included in the hydrofluorocarbon-containing etching gas composition.

13 Claims, 3 Drawing Sheets

GAS COMPOSITION FOR DRY ETCHING AND DRY ETCHING METHOD

TECHNICAL FIELD

The present invention relates to a gas composition for dry etching including a hydrofluorocarbon gas, and a dry etching method using the gas composition.

BACKGROUND ART

In present-day semiconductor devices, various active attempts, such as fine patterning and the use of novel materials, are being made to increase speed and reduce power consumption. Fine patterning of semiconductor devices involves dry etching using fluorocarbon (referred to hereinafter also as "FC") gas or hydrofluorocarbon (referred to hereinafter also as "HFC") gas plasmas.

It is commonly known that, with FC gas plasmas having an unsaturated bond or a cyclic structure including two or more carbon atoms, such as $C_4F_8$, $C_4F_6$, and $C_5F_8$, CFx radicals are deposited as a fluorocarbon polymer on, for example, a silicon nitride film (referred to hereinafter also as "SiN"), a polycrystalline silicon film (referred to hereinafter also as "polysilicon" or "Poly-Si"), or a resist, and the deposit serves as a protection film, thus allowing a silicon oxide film (referred to hereinafter also as "SiOm" (wherein m represents a natural number)) to be selectively etched relative to the aforementioned films.

It is also known that a silicon nitride film can be selectively etched relative to, for example, a silicon oxide film or a polysilicon film by using a HFC gas including one carbon atom, such as $CHF_3$, $CH_2F_2$, and $CH_3F$.

Patent Literature 1 discloses a technique for etching, with high selectivity, a silicon nitride film relative to a silicon oxide film and a silicon film by using an unsaturated fluorohydrocarbon compound represented by CxHyFz (wherein x=3, 4, or 5, y+z≤2x, and y>z) as the etching gas.

Patent Literature 2 discloses a technique for selectively etching a silicon-based material, such as a silicon oxide film or a silicon-containing low dielectric constant film (referred to hereinafter also as "low-k film"), relative to a mask, such as silicon or a resist, with a $C_4F_6$ or $C_5F_8$ gas plasma. In the technique disclosed in this Patent Literature, the $C_4F_6$ or $C_5F_8$ gas plasma produces a large amount of $CF^+$ and radicals including three or more carbon atoms in the skeleton thereof (polymer radicals produced from $CF_3CF=CFCF$ and $CFCF=CF_2$ fragments). The technique disclosed in this Patent Literature is also characteristic in that, although $CF^+$ has a low etching efficiency, damage to the resist and silicon is minimal, and that the radicals including three or more carbon atoms in the skeleton thereof form a fluorocarbon polymer film having low density. The technique disclosed in this Patent Literature is characteristic in that, by employing the aforementioned ions and radicals in a balanced manner, a silicon oxide film or a silicon-containing low dielectric constant film can be selectively etched without damaging the mask, such as the resist or silicon. The Patent Literature also describes that it is also possible to additionally achieve such effects as improved selectivity and low boiling point by replacing, with hydrogen, a portion of the fluorine atoms in the fluorocarbon gas having two double bonds, such as $C_4F_6$ or $C_5F_8$.

Patent Literature 3 discloses, in relation to the etching of hole structures patterned by a resist in a multilayer structure including a silicon oxide film and a silicon nitride film, a technique that allows selective etching of a silicon oxide film and a silicon nitride film relative to a resist by using a HFC-based gas plasma represented by CaHbFc (wherein a is from 3 to 5, b is from 1 to 2, and c is from 3 to 10). The decomposition of CaHbFc (wherein a is from 3 to 5, b is from 1 to 2, and c is from 3 to 10) in a plasma produces CF radicals originating from fluorocarbons and CH radicals originating from hydrocarbons. The CF radicals etch the silicon oxide film without reacting with the silicon nitride film. The CH radicals are smaller than the CF radicals, and thus, deeply penetrate the contact hole and etch the silicon nitride film.

CITATION LIST

Patent Literature

Patent Literature 1: US 2014306146 A1
Patent Literature 2: JP 2011-86966A
Patent Literature 3: JP 2008-300616A

SUMMARY OF INVENTION

Etching using $C_4F_8$, $C_4F_6$, $C_5F_8$, or the like has heretofore been employed as a method for selectively etching a silicon oxide film relative to a resist, a silicon film (crystalline silicon, amorphous silicon, or polysilicon), a silicon nitride film, a carbon-containing silicon-based film (e.g., SiC, SiOC, SiCN, SiOCN), or the like. Further, selectivity toward silicon oxide film is improved by adding $H_2$, CO, or a HFC gas, such as $CH_2F_2$ or $CH_3F$, to the aforementioned FC gases. Also, by etching using a HFC gas, a silicon nitride film is selectively etched relative to a resist, a silicon film (crystalline silicon, amorphous silicon, polysilicon), a carbon-containing silicon-based film, or the like.

In order to selectively etch each of the silicon oxide film and the silicon nitride film relative to a resist, a silicon film (crystalline silicon, amorphous silicon, polysilicon), or a carbon-containing silicon-based film, it is necessary to change the types of FC gases and HFC gases in accordance with the respective types of films.

Also, in recent years, low dielectric constant materials, such as SiOC, are used for carbon-containing silicon-based films in order to reduce parasitic capacitance that increases with the miniaturization of semiconductor devices. It is, however, difficult to selectively etch silicon oxide films and silicon nitride films relative to low dielectric constant materials with existing FC gases and/or HFC gases. Actual device production involves problems such as that the low dielectric constant film is damaged at the time of dry etching (the composition and/or structure of the film are/is changed by the penetration of ions or by ultraviolet rays generated by plasma, and thus, electric characteristics such as permittivity are changed).

As a result of diligent research to solve the aforementioned problems, Inventors have found that an etching gas composition including a specific hydrofluorocarbon is effective, thus arriving at the present invention.

More specifically, by using a HFC gas that has an unsaturated bond in its molecule and is represented by CxHyFz, wherein x is an integer of from 3 to 5 and relationships y+z≤2x and y≤z are satisfied, it is possible to selectively etch a silicon oxide film, or a silicon oxide film and a silicon nitride film, relative to a carbon film as represented by amorphous carbon (referred to hereinafter also as "ACL"), a silicon film as represented by Poly-Si, a silicon oxynitride film (referred to hereinafter also as "SiON"), or a carbon-containing silicon-based film as represented by SiC, SiOC, SiCN, or SiOCN.

The present invention provides the following aspects.

Aspect 1: A gas composition for dry etching, including a HFC gas that has an unsaturated bond in its molecule and is represented by CxHyFz, wherein x is an integer of from 3 to 5, and relationships y+z≤2x and y≤z are satisfied.

Aspect 2: The gas composition for dry etching as set forth in Aspect 1, wherein the HFC gas includes 1,1,4,4-tetrafluoro-1,3-butadiene.

Aspect 3: The gas composition for dry etching as set forth in Aspect 2, wherein the content of 1,1,4,4-tetrafluoro-1,3-butadiene in the HFC is from 1 to 100 vol %.

Aspect 4: The gas composition for dry etching as set forth in Aspect 2 or 3, wherein the gas composition for dry etching includes, in addition to 1,1,4,4-tetrafluoro-1,3-butadiene, at least one compound selected from the group of oxygen-atom-containing compounds consisting of $O_2$, $O_3$, CO, $CO_2$, NO, $NO_2$, $SO_2$, and $SO_3$.

Aspect 5: The gas composition for dry etching as set forth in Aspect 2, wherein the gas composition for dry etching includes, in addition to 1,1,4,4-tetrafluoro-1,3-butadiene, at least one compound selected from the group of inert gases consisting of $N_2$, He, Ar, Ne, and Xe.

Aspect 6: A dry etching method involving a selective etching step wherein a multilayer structure including (a1) a carbon-containing silicon-based film, (a2) a crystalline silicon film, (a3) an amorphous silicon film, (a4) a polycrystalline silicon film (polysilicon film), (a5) a silicon oxynitride film, or (a6) an amorphous carbon film, and (b1) a silicon oxide film or (b2) a silicon nitride film is subjected to etching by using the gas composition for dry etching as set forth in any one of Aspects 1 to 5, and thus selectively etching the silicon oxide film (b1) or the silicon nitride film (b2).

Aspect 7: The dry etching method as set forth in Aspect 6, wherein etching with the gas composition for dry etching is performed under a plasma condition in which the silicon oxide film (b1) and the silicon nitride film (b2) can be etched simultaneously.

Aspect 8: The dry etching method as set forth in Aspect 6, wherein etching of the silicon oxide film (b1) is performed selectively relative to the silicon nitride film (b2).

Aspect 9: The dry etching method as set forth in any one of Aspects 6 to 8, wherein etching is performed by turning the etching gas composition into plasma so that ions having 3 to 5 carbon atoms are produced.

DESCRIPTION OF EMBODIMENTS

Figure 1A:
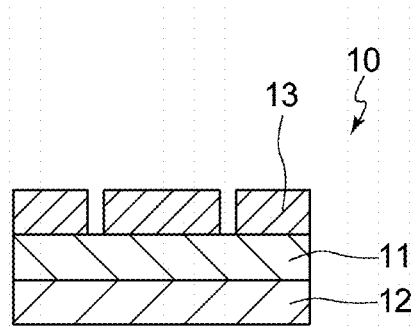
FIGS. 1(a) and 1(b) are diagrams of steps sequentially illustrating a method for performing dry etching according to the invention.

A gas composition for dry etching according to the present invention and a dry etching method using the same are described in detail below. The scope of the invention is not limited to the scope described below, and various modifications can be made within a scope that does not depart from the gist of the invention.

A gas composition for dry etching of the invention includes a HFC gas that is represented by formula (1) below. In the formula, x is an integer of from 3 to 5, and y and z are also positive integers and satisfy the relationships y+z≤2x and y≤z.

$$CxHyFz \quad (1)$$

The HFC gas represented by formula (1) includes an unsaturated bond in its molecule. The unsaturated bond is C=C and/or C≡C. There is at least one unsaturated bond depending on the number of carbon atoms in the HFC gas represented by formula (1).

In the invention, it is possible to use one type, or two or more types, of the HFC gas(es) represented by formula (1). The HFC gas represented by formula (1) may have a chain structure, or may have a cyclic structure. In the case where the HFC gas represented by formula (1) has a chain structure, the chain structure may be a straight chain or may be a branched chain.

In the case where the HFC gas represented by formula (1) has three carbon atoms, examples of preferable basic skeletons of the HFC gas include the following (3a) to (3d).

 (3a)

 (3b)

 (3c)

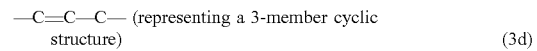 —C=C—C— (representing a 3-member cyclic structure) (3d)

In the case where the HFC gas represented by formula (1) has four carbon atoms, examples of preferable basic skeletons of the HFC gas include the following (4a) to (4o).

 (4a)

 (4b)

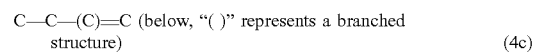 C—C—(C)=C (below, "( )" represents a branched structure) (4c)

 (4d)

 (4e)

 (4f)

 (4g)

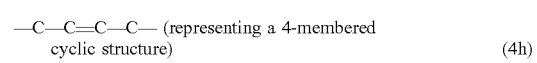 —C—C=C—C— (representing a 4-membered cyclic structure) (4h)

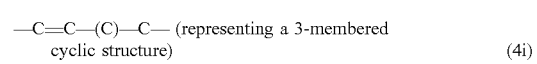 —C=C—(C)—C— (representing a 3-membered cyclic structure) (4i)

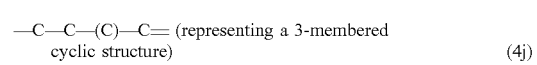 —C—C—(C)—C= (representing a 3-membered cyclic structure) (4j)

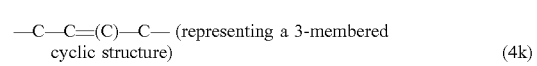 —C—C=(C)—C— (representing a 3-membered cyclic structure) (4k)

 (4l)

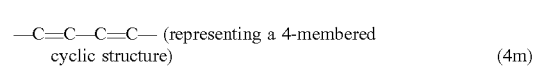 —C=C—C=C— (representing a 4-membered cyclic structure) (4m)

—C—C=(C)—C= (representing a 3-membered cyclic structure) (4n)

C≡C—C=C (4o)

In the case where the HFC gas represented by formula (1) has five carbon atoms, examples of preferable basic skeletons of the HFC gas include the following (5a) to (5as).

C=C—C—C—C (5a)

C—C=C—C—C (5b)

C—C—C—(C)=C (5c)

C—C=C—(C)—C (5d)

C≡C—C—C—C (5e)

C—C≡C—C—C (5f)

C=C—C=C—C (5g)

C=C=C—C—C (5h)

C=C—C—C=C (5i)

C=C—(C)—C=C (5j)

C—C—(C)—C=C (5k)

C—C=C=C—C (5l)

C—C—(C)=C=C (5m)

—C—C=C—C—C— (representing a 5-membered cyclic structure) (5n)

—C—C—(C)—C=C— (representing a 4-membered cyclic structure) (5o)

—C=C—(C)—C—C— (representing a 4-membered cyclic structure) (5p)

—C—C=(C)—C—C— (representing a 4-membered cyclic structure) (5q)

—C—(C)—C—(C)=C— (representing a 3-membered cyclic structure) (5r)

—C—(C)=C—(C)—C— (representing a 3-membered cyclic structure) (5s)

—C=(C)—C—(C)—C— (representing a 3-membered cyclic structure) (5t)

—C—C—(C)(C)—C= (representing a 3-membered cyclic structure) (5u)

—C—C—(C—C)=C— (representing a 3-membered cyclic structure) (5v)

—C—C—(C—C)—C= (representing a 3-membered cyclic structure) (5w)

—C—C=(C—C)—C— (representing a 3-membered cyclic structure) (5x)

—C—C—(C=C)—C— (representing a 3-membered cyclic structure) (5y)

C≡C—C=C—C (5z)

C=C=C=C—C (5aa)

C=C—C—C≡C (5ab)

C=C—(C)—C≡C (5ac)

C=C—C≡C—C (5ad)

C=C—C=C=C (5ae)

—C—C=C—C=C— (representing a 5-membered cyclic structure) (5af)

—C=C—(C)—C=C— (representing a 4-membered cyclic structure) (5ag)

—C—C=(C)—C=C— (representing a 4-membered cyclic structure) (5ah)

—C=(C)—C=(C)—C— (representing a 3-membered cyclic structure) (5ai)

—C=(C)—C—(C)=C— (representing a 3-membered cyclic structure) (5aj)

—C=C—(C=C)—C— (representing a 3-membered cyclic structure) (5ak)

—C—C=(C—C)—C= (representing a 3-membered cyclic structure) (5al)

—C—C—(C=C)—C= (representing a 3-membered cyclic structure) (5am)

—C—C—(C≡C)—C— (representing a 3-membered cyclic structure) (5an)

C≡C—C—C≡C (5ao)

C—C≡C—C≡C (5ap)

C=C=C—C≡C (5aq)

—C—C—(C≡C)—C= (representing a 3-membered cyclic structure) (5ar)

—C=C—(C=C)—C— (representing a 3-membered cyclic structure) (5as)

In the case where the HFC gas used in the invention is represented by the aforementioned formula (3a), it is preferable that the number of fluorine atoms included therein is from 3 to 5. In the case where the HFC gas is represented by one of the aforementioned formulas (3b) to (3d), it is preferable that the number of fluorine atoms is from 2 to 3.

In the case where the HFC gas used in the invention is represented by one of the aforementioned formulas (4a) to (4c), it is preferable that the number of fluorine atoms included therein is from 4 to 7. In the case where the HFC gas is represented by one of the aforementioned formulas (4d) to (4k), it is preferable that the number of fluorine atoms is from 3 to 5. In the case where the HFC gas is represented by one of the aforementioned formulas (4l) to (4n), it is preferable that the number of fluorine atoms is from 2 to 3. In the case where the HFC gas is represented by the aforementioned formula (4o), the number of fluorine atoms is 1.

In the case where the HFC gas used in the invention is represented by one of the aforementioned formulas (5a) to (5d), it is preferable that the number of fluorine atoms included therein is from 5 to 9. In the case where the HFC gas is represented by one of the aforementioned formulas (5e) to (5y), it is preferable that the number of fluorine atoms is from 4 to 8. In the case where the HFC gas is represented by one of the aforementioned formulas (5z) to (5an), it is preferable that the number of fluorine atoms is from 3 to 5. In the case where the HFC gas is represented by one of the aforementioned formulas (5ao) to (5as), it is preferable that the number of fluorine atoms is from 2 to 3.

HFC gases that may be preferably used in the invention are represented by one of the aforementioned formulas (4a) to (4o); among the above, gases represented by formula (4f) are further preferred. It is preferable that, in the HFC gases represented by formula (4f), the number of fluorine atoms is from 3 to 5, and more preferably, the number of fluorine atoms is 4. Particularly, the HFC gas represented by formula (4f) is preferably 1,1,4,4-tetrafluoro-1,3-butadiene. More specifically, in the invention, by using a gas plasma of 1,1,4,4-tetrafluoro-1,3-butadiene, wherein a portion of the fluorine atoms in $C_4F_6$ is replace by hydrogen, it is possible to etch a silicon oxide film and/or a silicon nitride film with high selectivity relative to mask materials, such as ACL, Poly-Si, and SiON, and also relative to SiOC, which is a silicon-containing low-k material.

Many of the HFC gases represented by the various structures shown above are known substances, and can be produced and obtained by known methods. For example, such gases can be produced and obtained by methods described in the Journal of Fluorine Chemistry (1997), vol. 82 (2), pp. 171-174. Alternatively, commercially available products may be used as-is, or after purification as desired.

The etching method of the invention is a dry etching method using plasma, and is performed by using a gas composition for dry etching including one type, or two or more types, of HFC gas(es) represented by formula (1). Particularly, it is preferable to use only 1,1,4,4-tetrafluoro-1,3-butadiene as the HFC gas represented by formula (1).

In the dry-etching gas composition used for etching, it is preferable that the content of 1,1,4,4-tetrafluoro-1,3-butadiene in the HFC gas is from 1 to 100 vol %. Particularly, the purity of 1,1,4,4-tetrafluoro-1,3-butadiene can be 90 vol % or higher, and it is preferable that the purity is 99 vol % or higher, and more preferably 99.999 vol % or higher. The effect of the invention is further enhanced when the purity is within the aforementioned range.

The etching gas composition used in the plasma etching method of the invention preferably includes, in addition to HFC gas(es) represented by formula (1), at least one compound selected from the group of oxygen-atom-containing compounds consisting of $O_2$, $O_3$, CO, $CO_2$, NO, $NO_2$, $SO_2$, and $SO_3$. Particularly among the group of oxygen-atom-containing compounds, it is more preferable to use $O_2$. The percentage of the group of oxygen-atom-containing compounds within the etching gas composition is preferably from 10 vol % to 80 vol %, more preferably from 10 vol % to 60 vol %.

Further, it is preferable that the etching gas composition includes the HFC gas(es) represented by formula (1), and at least one compound selected from the group of inert gases consisting of $N_2$, He, Ar, Ne, and Xe, in addition to, or in place of, the aforementioned oxygen-atom-containing compound(s). Particularly among the group of inert gases, it is more preferable to use Ar.

The percentage of the HFC gas(es) represented by formula (1) mixed in the etching gas composition is preferably within the range from 1 to 100 vol %. The percentage of gas(es) selected from the group of oxygen-atom-containing compounds consisting of $O_2$, $O_3$, CO, $CO_2$, NO, $NO_2$, $SO_2$, and $SO_3$ is preferably within the range from 1 to 80 vol %. The percentage of gas(es) selected from the group of inert gases consisting of $N_2$, He, Ar, Ne, and Xe is preferably within the range from 1 to 80 vol %. Particularly in the case where $O_2$ is used, the effect of the invention is further enhanced by mixing the HFC gas(es) represented by formula (1) at a percentage (by volume) of from 5 to 50 vol % and mixing $O_2$ at a percentage of from 10 to 80 vol %.

Plasma etching of the invention is preferably performed within a pressure range from 0.01 to 100 Pa, more preferably within a range from 0.1 to 10 Pa.

Any plasma etching device known in the present technical field may be used without particular limitation. For example, it is possible to use a helicon wave-type, a high-frequency induction-type, a parallel plate-type, a magnetron-type, or a microwave-type device.

The plasma density is not particularly limited, but it is preferable to perform etching in a high-density plasma atmosphere of $10^8$ ions/cm$^3$ or higher, more preferably from $10^8$ to $10^{13}$ ions/cm$^3$.

An example of an object subjected to plasma etching is a multilayer structure including: (a1) a carbon-containing silicon-based film, (a2) a crystalline silicon film, (a3) an amorphous silicon film, (a4) a polycrystalline silicon film (polysilicon film), (a5) a silicon oxynitride film, or (a6) an amorphous carbon film; and (b1) a silicon oxide film or (b2) a silicon nitride film. In this type of multilayer structure, the film (b1) or (b2) (referred to hereinafter as "first layer 11") can serve as the etching surface as illustrated in FIG. 1(*a*), or the film of one of (a1) to (a6) (referred to hereinafter as "second layer 12") can serve as the etching surface as illustrated in FIG. 2(*a*).

Figure 1B:
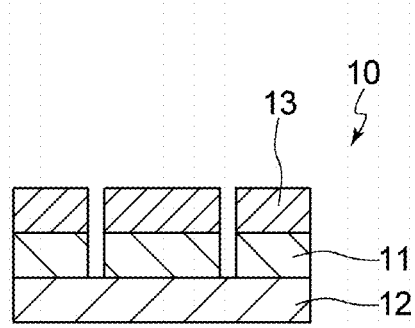

In the embodiment illustrated in FIG. 1(*a*), a mask 13 having a predetermined pattern formed thereon is arranged on a surface of a first layer 11 of a multilayer structure 10, and dry etching is performed from the mask 13 side. The HFC gas represented by formula (1) selectively etches the first layer 11 as illustrated in FIG. 1(*b*), and the etching progresses to a surface of a second layer 12 located beneath the first layer 11. The HFC gas represented by formula (1) does not etch the second layer 12, and thus, the etching stops when the surface of the second layer 12 is exposed.

Figure 2A:
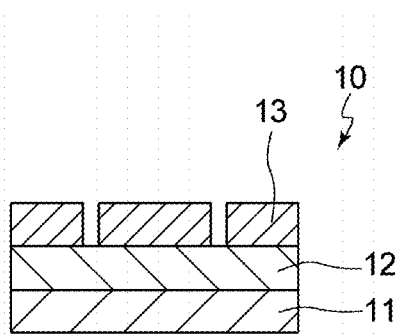
FIGS. 2(a) to 2(c) are diagrams of steps sequentially illustrating another method for performing dry etching according to the invention.
Figure 2B:
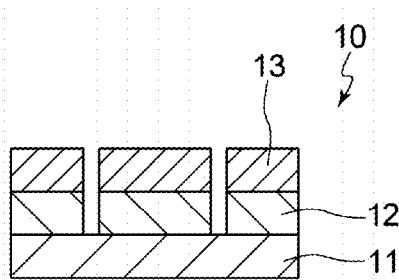
Figure 2C:
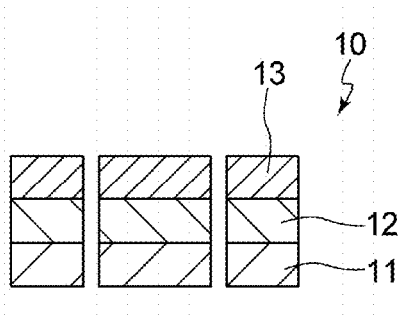

In the embodiment illustrated in FIG. 2(*a*), a mask 13 having a predetermined pattern formed thereon is arranged on a surface of the second layer 12 of the multilayer structure 10, and the layer 12 is etched as illustrated in FIG. 2(*b*) by using a gas capable of selectively etching the second layer 12. Then, as illustrated in FIG. 2(*c*), the HFC gas represented by formula (1) is used to selectively etch the first layer 11. At this time, the second layer 12 is not etched.

Figure 3A:
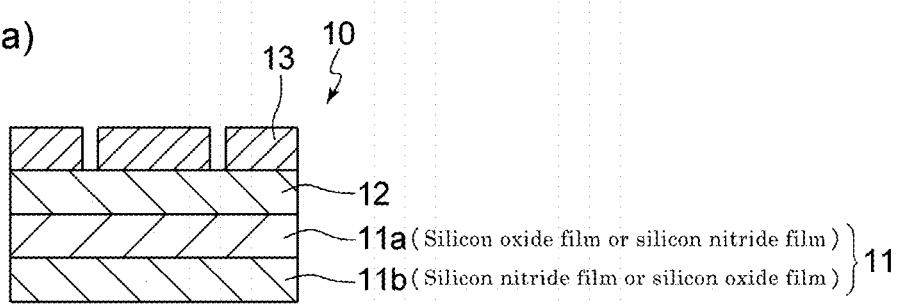
FIGS. 3(a) to 3(c) are cross-sectional views illustrating multilayer structures of objects to be etched by dry etching methods of the invention, and diagrams illustrating other methods for performing dry etching according to the invention.
Figure 3B:
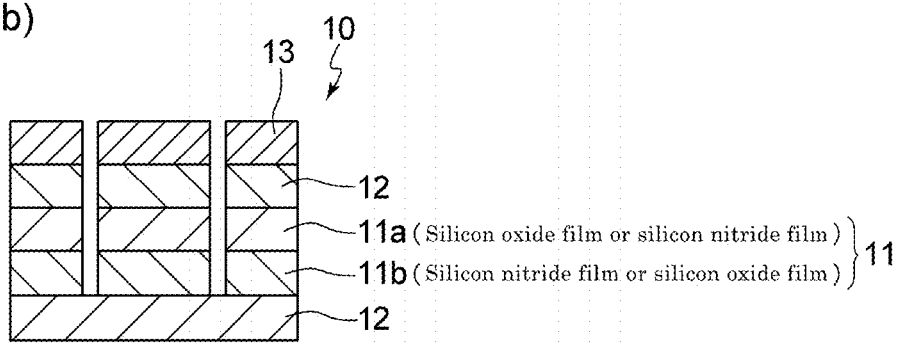

In both the embodiments illustrated in FIGS. 1 and 2, etching can be performed under a plasma condition in which the silicon oxide film (b1) and the silicon nitride film (b2) can be etched simultaneously by appropriately controlling the plasma etching condition. This simultaneous etching is advantageous in the case where the first layer 11 consists of a multilayer structure including an upper layer 11*a* made of a silicon oxide film or a silicon nitride film and a lower layer 11*b* made of a silicon nitride film or a silicon oxide film, as illustrated in FIG. 3(*a*). Particularly in the case where the multilayer structure 10 further includes a second layer 12 arranged below the lower layer 11*b* as illustrated in FIG. 3(*b*), the HFC gas represented by formula (1) etches the upper layer 11*a* and the lower layer 11*b* simultaneously, but the lowermost second layer 12 is not etched. That is, the etching stops on the surface of the lowermost second layer 12. An example of a plasma condition in which the silicon oxide film (b1) and the silicon nitride film (b2) can be etched simultaneously is a condition where the etching gas composition contains 5 to 40 vol % of 1,1,4,4-tetrafluoro-1,3-butadiene, 15 to 80 vol % of $O_2$, and 0 to 75 vol % of Ar, and the ratio of 1,1,4,4-tetrafluoro-1,3-butadiene to $O_2$ is selected discretionarily from 1:X (wherein 3≤X). The conditions for the pressure and RF power can be set such that a silicon oxide film and a silicon nitride film can be etched simultaneously in the aforementioned gas composition; for example, the pressure may be 10 Pa, and the RF power may be 300 W.

Figure 3C:
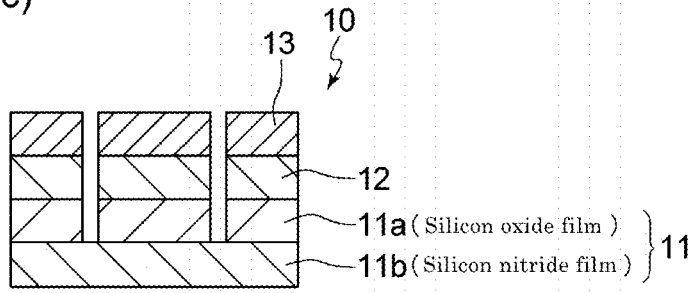

In contrast to the aforementioned simultaneous etching, in an embodiment where the first layer 11 of the multilayer structure 10 is constituted by an upper layer 11a made of a silicon oxide film and a lower layer 11b made of a silicon nitride film and the first layer 11 is arranged below the second layer as illustrated in FIG. 3(c), etching of the silicon oxide film (b1) may be performed selectively relative to the silicon nitride film (b2). With this selective etching, the upper layer 11a made of a silicon oxide film is etched whereas the lower layer 11b made of a silicon nitride film is not, and the etching stops at a stage where the surface of the lower layer 11b is exposed. An example of a plasma condition in which this kind of etching is possible is a condition where the etching gas composition contains 5 to 50 vol % of 1,1,4,4-tetrafluoro-1,3-butadiene, 10 to 75 vol % $O_2$, and 0 to 85 vol % of Ar, and the ratio of 1,1,4,4-tetrafluoro-1,3-butadiene to $O_2$ is selected discretionarily from 1:X (wherein 0<X<3). The conditions for the pressure and RF power can be set such that a silicon oxide film can be etched but a silicon nitride film is hard to etch in the aforementioned gas composition; for example, the pressure may be 10 Pa, and the RF power may be 300 W.

In all of the embodiments illustrated in FIGS. 1 to 3, it is preferable to use, for etching, ions having 3 to 5 carbon atoms, which are produced by turning the etching gas composition into plasma, because highly selective etching can be performed. For example, when 1,1,4,4-tetrafluoro-1,3-butadiene is employed as the HFC gas, a plasma condition capable of producing such ions is a condition where 1,1,4,4-tetrafluoro-1,3-butadiene ranges from 5 to 50 vol %, $O_2$ ranges from 10 to 80 vol %, and Ar ranges from 0 to 85 vol %. The conditions for the pressure and RF power can be set such that ions having 3 to 5 carbon atoms can be produced with the aforementioned gas composition; for example, the pressure may be 10 Pa, and the RF power may be 300 W.

EXAMPLES

The present invention is described in further detail below according to Examples and Comparative Examples. The invention, however, is not limited thereto.

In the present Examples, a parallel plate-type capacitively coupled plasma etching device was used for the plasma etching device. The silicon oxide film (SiOm) (m represents a natural number) used was obtained by depositing 1000 nm of a $SiO_2$ film on a silicon wafer by plasma CVD. The silicon nitride film (SiN) used was obtained by depositing 300 nm of a SiN film on a silicon wafer by thermal CVD. The polysilicon film used was obtained by depositing, by plasma CVD, 300 nm of a Poly-Si film on a laminate obtained by depositing 100 nm of a $SiO_2$ film on a silicon wafer. The amorphous carbon film used was obtained by depositing 100 nm of ACL on a silicon wafer by plasma CVD. The carbon-containing silicon film used was obtained by depositing 500 nm of Black Diamond 3 (referred to hereinafter as "BD-3"), which is a type of SiOC, on a silicon wafer.

The etching rate measurement in plasma etching was calculated according to the following equation.

Etching rate (nm/min)=[Sample film thickness before etching (nm)−Sample film thickness after etching (nm)]/Etching time (min).

The film thickness of a sample was measured with an optical interference film-thickness measurement device.

Examples 1 to 5

A plasma was generated using a composition of 14 vol % 1,1,4,4-tetrafluoro-1,3-butadiene, 50 vol % $O_2$, and 36 vol % Ar under a pressure condition of 10 Pa and RF power condition of 300 W, and respective samples of a $SiO_2$ film, a SiN film, a Poly-Si film, an ACL film, and a BD-3 film were each subjected to etching. The 1,1,4,4-tetrafluoro-1,3-butadiene employed was produced according to the method described in the Journal of American Chemical Society (1961), vol. 83, pp. 382-5. The etching rate of each sample was as follows: $SiO_2$ film: 18.3 nm/min; SiN film: 0 nm/min; Poly-Si film: 0 nm/min; ACL film: 0 nm/min; BD-3: 0 nm/min. The selectivity ratio of the $SiO_2$ film relative to the other types of films, as calculated by the following equation using the etching rates of the respective samples, was infinity. In the present Examples, it was verified that ions having 3 to 5 carbon atoms were produced during plasma etching. This was verified by introducing a quadrupole mass spectrometer in a treatment chamber in which the plasma was generated, and subjecting the ions in the plasma to mass spectrometry.

Selectivity ratio=Etching rate of film for which selectivity ratio is to be found/Etching rate of another film.

Examples 6 to 10

A plasma was generated using a composition of 13 vol % 1,1,4,4-tetrafluoro-1,3-butadiene, 53 vol % $O_2$, and 34 vol % Ar under a pressure condition of 10 Pa and RF power condition of 300 W, and respective samples of a $SiO_2$ film, a SiN film, a Poly-Si film, an ACL film, and a BD-3 film were each subjected to etching. The etching rate of each sample was as follows: $SiO_2$ film: 30.6 nm/min; SiN film: 17.4 nm/min; Poly-Si film: 1.1 nm/min; ACL film: 0 nm/min; BD-3: 0 nm/min. The selectivity ratio of the $SiO_2$ film relative to the other types of films was as follows: relative to SiN film: 1.8; relative to Poly-Si film: 27.8; relative to ACL film: infinity; relative to BD-3 film: infinity. The selectivity ratio of the SiN film relative to the other types of films was as follows: relative to $SiO_2$ film: 0.6; relative to Poly-Si: 15.8; relative to ACL film: infinity; relative to BD-3 film: infinity. In the present Examples, it was verified that ions having 3 to 5 carbon atoms were produced during plasma etching.

Comparative Examples 1 to 5

These Comparative Examples are examples in which $C_4F_6$ was used instead of 1,1,4,4-tetrafluoro-1,3-butadiene, which was the etching gas used in the Examples. A plasma was generated using a composition of 20 vol % $C_4F_6$, 30 vol % $O_2$, and 50 vol % Ar under a pressure condition of 10 Pa and RF power condition of 300 W, and respective samples of a $SiO_2$ film, a SiN film, a Poly-Si film, an ACL film, and a BD-3 film were each subjected to etching. The etching rate of each sample was as follows: $SiO_2$ film: 63.6 nm/min; SiN film: 12.4 nm/min; Poly-Si film: 5.9 nm/min; ACL film: 0 nm/min; BD-3: 29.7 nm/min. The selectivity ratio of the $SiO_2$ film relative to the other types of films was as follows: relative to SiN film: 5.1; relative to Poly-Si film: 10.8; relative to ACL film: infinity; relative to BD-3 film: 2.1. The selectivity ratio of the SiN film relative to the other types of films was as follows: relative to $SiO_2$ film: 0.2; relative to Poly-Si: 2.1; relative to ACL film: infinity; relative to BD-3 film: 0.4.

Comparative Examples 6 to 10

These Comparative Examples are also examples in which $C_4F_6$ was used instead of 1,1,4,4-tetrafluoro-1,3-butadiene, which was the etching gas used in the Examples. A plasma was generated using a composition of 14 vol % $C_4F_6$, 50 vol % $O_2$, and 36 vol % Ar under a pressure condition of 10 Pa and RF power condition of 300 W, and film samples were each subjected to etching. The etching rate of each sample was as follows: $SiO_2$ film: 45.0 nm/min; SiN film: 48.5 nm/min; Poly-Si film: 31.0 nm/min; ACL film: 58.1 nm/min; BD-3: 92.0 nm/min. The selectivity ratio of the $SiO_2$ film relative to the other types of films was as follows: relative to SiN film: 0.9; relative to Poly-Si film: 1.5; relative to ACL film: 0.8; relative to BD-3 film: 0.5. The selectivity ratio of the SiN film relative to the other types of films was as follows: relative to $SiO_2$ film: 1.1; relative to Poly-Si: 1.6; relative to ACL film: 0.8; relative to BD-3 film: 0.5.

Comparative Examples 10 to 15

These Comparative Examples are also examples in which $C_4F_6$ was used instead of 1,1,4,4-tetrafluoro-1,3-butadiene, which was the etching gas used in the Examples. A plasma was generated using a composition of 13 vol % $C_4F_6$, 53 vol % $O_2$, and 34 vol % Ar under a pressure condition of 10 Pa and RF power condition of 300 W, and respective samples of a $SiO_2$ film, a SiN film, a Poly-Si film, an ACL film, and a BD-3 film were each subjected to etching. The etching rate of each sample was as follows: $SiO_2$ film: 43.9 nm/min; SiN film: 45.0 nm/min; Poly-Si film: 26.7 nm/min; ACL film: 68.3 nm/min; BD-3: 90.3 nm/min. The selectivity ratio of the $SiO_2$ film relative to the other types of films was as follows: relative to SiN film: 1.0; relative to Poly-Si film: 1.6; relative to ACL film: 0.6; relative to BD-3 film: 0.5. The selectivity ratio of the SiN film relative to the other types of films was as follows: relative to $SiO_2$ film: 1.0; relative to Poly-Si: 1.7; relative to ACL film: 0.7; relative to BD-3 film: 0.5.

Comparative Examples 16 to 20

These Comparative Examples are examples in which $CH_3F$ was used instead of 1,1,4,4-tetrafluoro-1,3-butadiene, which was the etching gas used in the Examples. A plasma was generated using a composition of 29 vol % $CH_3F$, 0 vol % $O_2$, and 71 vol % Ar under a pressure condition of 10 Pa and RF power condition of 300 W, and respective samples of a $SiO_2$ film, a SiN film, a Poly-Si film, an ACL film, and a BD-3 film were each subjected to etching. The result was that etching did not proceed in any of the samples.

Comparative Examples 21 to 25

These Comparative Examples are also examples in which $CH_3F$ was used instead of 1,1,4,4-tetrafluoro-1,3-butadiene, which was the etching gas used in the Examples. A plasma was generated using a composition of 27 vol % $CH_3F$, 6 vol % $O_2$, and 67 vol % Ar under a pressure condition of 10 Pa and RF power condition of 300 W, and respective samples of a $SiO_2$ film, a SiN film, a Poly-Si film, an ACL film, and a BD-3 film were each subjected to etching. The etching rate of each sample was as follows: $SiO_2$ film: 17.7 nm/min; SiN film: 123.4 nm/min; Poly-Si film: 6.8 nm/min; ACL film: 10.0 nm/min; BD-3: 24.6 nm/min. The selectivity ratio of the $SiO_2$ film relative to the other types of films was as follows: relative to SiN film: 0.1; relative to Poly-Si film: 2.6; relative to ACL film: 1.8; relative to BD-3 film: 0.7. The selectivity ratio of the SiN film relative to the other types of films was as follows: relative to $SiO_2$ film: 7.0; relative to Poly-Si: 18.1; relative to ACL film: 12.3; relative to BD-3 film: 5.0.

Comparative Examples 21 to 30

These Comparative Examples are also examples in which $CH_3F$ was used instead of 1,1,4,4-tetrafluoro-1,3-butadiene, which was the etching gas used in the Examples. A plasma was generated using a composition of 25 vol % $CH_3F$, 13 vol % $O_2$, and 62 vol % Ar under a pressure condition of 10 Pa and RF power condition of 300 W, and respective samples of a $SiO_2$ film, a SiN film, a Poly-Si film, an ACL film, and a BD-3 film were each subjected to etching. The etching rate of each sample was as follows: $SiO_2$ film: 9.9 nm/min; SiN film: 91.5 nm/min; Poly-Si film: 6.6 nm/min; ACL film: 84.7 nm/min; BD-3: 27.0 nm/min. The selectivity ratio of the $SiO_2$ film relative to the other types of films was as follows: relative to SiN film: 0.1; relative to Poly-Si film: 1.5; relative to ACL film: 0.1; relative to BD-3 film: 0.4. The selectivity ratio of the SiN film relative to the other types of films was as follows: relative to $SiO_2$ film: 9.2; relative to Poly-Si: 13.9; relative to ACL film: 1.1; relative to BD-3 film: 3.4.

The etching results are shown in the table below.

TABLE 1

| | Etching condition | Etching sample | Etching gas (vol %) | $O_2$ (vol %) | Ar (vol %) | Etching rate (nm/min) | $SiO_2$ film selectivity | SiN film selectivity |
|---|---|---|---|---|---|---|---|---|
| Example 1 | Etching gas: | $SiO_2$ film | 14 | 50 | 36 | 18.3 | — | — |
| Example 2 | $C_4H_2F_4$ | SiN film | 14 | 50 | 36 | 0 | ∞ | — |
| Example 3 | Pressure: 10 Pa | Poly-Si film | 14 | 50 | 36 | 0 | ∞ | — |
| Example 4 | RF power: 300 W | ACL film | 14 | 50 | 36 | 0 | ∞ | — |
| Example 5 | | BD-3 film | 14 | 50 | 36 | 0 | ∞ | — |
| Example 6 | | $SiO_2$ film | 13 | 53 | 34 | 30.6 | — | 0.6 |
| Example 7 | | SiN film | 13 | 53 | 34 | 17.4 | 1.8 | — |
| Example 8 | | Poly-Si film | 13 | 53 | 34 | 1.1 | 27.8 | 15.8 |
| Example 9 | | ACL film | 13 | 53 | 34 | 0 | ∞ | ∞ |
| Example 10 | | BD-3 film | 13 | 53 | 34 | 0 | ∞ | ∞ |
| Comp. Example 1 | Etching gas: $C_4F_6$ | $SiO_2$ film | 20 | 30 | 50 | 63.6 | — | 0.2 |
| Comp. Example 2 | Pressure: 10 Pa | SiN film | 20 | 30 | 50 | 12.4 | 5.1 | — |
| Comp. Example 3 | RF power: 300 W | Poly-Si film | 20 | 30 | 50 | 5.9 | 10.8 | 2.1 |
| Comp. Example 4 | | ACL film | 20 | 30 | 50 | 0 | ∞ | ∞ |

TABLE 1-continued

| | Etching condition | Etching sample | Etching gas (vol %) | $O_2$ (vol %) | Ar (vol %) | Etching rate (nm/min) | $SiO_2$ film selectivity | SiN film selectivity |
|---|---|---|---|---|---|---|---|---|
| Comp. Example 5 | | BD-3 film | 20 | 30 | 50 | 29.7 | 2.1 | 0.4 |
| Comp. Example 6 | | $SiO_2$ film | 14 | 50 | 36 | 45.0 | — | 1.1 |
| Comp. Example 7 | | SiN film | 14 | 50 | 36 | 48.4 | 0.9 | — |
| Comp. Example 8 | | Poly-Si film | 14 | 50 | 36 | 31.0 | 1.5 | 1.6 |
| Comp. Example 9 | | ACL film | 14 | 50 | 36 | 58.1 | 0.8 | 0.8 |
| Comp. Example | | BD-3 film | 14 | 50 | 36 | 92.0 | 0.5 | 0.5 |
| Comp. Example | | $SiO_2$ film | 13 | 53 | 34 | 43.9 | — | 1.0 |
| Comp. Example | | SiN film | 13 | 53 | 34 | 45.0 | 1.0 | — |
| Comp. Example | | Poly-Si film | 13 | 53 | 34 | 26.7 | 1.6 | 1.7 |
| Comp. Example | | ACL film | 13 | 53 | 34 | 68.3 | 0.6 | 0.7 |
| Comp. Example | | BD-3 film | 13 | 53 | 34 | 90.3 | 0.5 | 0.5 |
| Comp. Example | Etching gas: | $SiO_2$ film | 29 | 0 | 71 | 0 | — | — |
| Comp. Example | $CH_3F$ | SiN film | 29 | 0 | 71 | 0 | — | — |
| Comp. Example | Pressure: 10 Pa | Poly-Si film | 29 | 0 | 71 | 0 | — | — |
| Comp. Example | RF power: 300 W | ACL film | 29 | 0 | 71 | 0 | — | — |
| Comp. Example | | BD-3 film | 29 | 0 | 71 | 0 | — | — |
| Comp. Example | | $SiO_2$ film | 27 | 6 | 67 | 17.7 | — | 7.0 |
| Comp. Example | | SiN film | 27 | 6 | 67 | 123.4 | 0.1 | — |
| Comp. Example | | Poly-Si film | 27 | 6 | 67 | 6.8 | 2.6 | 18.1 |
| Comp. Example | | ACL film | 27 | 6 | 67 | 10.0 | 1.8 | 12.3 |
| Comp. Example | | BD-3 film | 27 | 6 | 67 | 24.6 | 0.7 | 5.0 |
| Comp. Example | | $SiO_2$ film | 25 | 13 | 62 | 9.9 | — | 9.2 |
| Comp. Example | | SiN film | 25 | 13 | 62 | 91.5 | 0.1 | — |
| Comp. Example | | Poly-Si film | 25 | 13 | 62 | 6.6 | 1.5 | 13.9 |
| Comp. Example | | ACL film | 25 | 13 | 62 | 84.7 | 0.1 | 1.1 |
| Comp. Example | | BD-3 film | 25 | 13 | 62 | 27.0 | 0.4 | 3.4 |

Examples 1 to 5 show that an etching gas composition including 1,1,4,4-tetrafluoro-1,3-butadiene is capable of etching a $SiO_2$ film with high selectivity relative to other films.

Examples 6 to 10 show that, by adjusting the flow amount of $O_2$ in an etching gas composition including 1,1,4,4-tetrafluoro-1,3-butadiene, both $SiO_2$ and SiN films can be etched with high selectivity relative to other films.

A comparison between the results of the present Examples and the results of Comparative Examples 1 to 30 shows that etching can be performed with greater selectivity by using an etching gas composition including 1,1,4,4-tetrafluoro-1,3-butadiene, compared to existing etching gases.

INDUSTRIAL APPLICABILITY

With the etching gas composition including a HFC gas represented by formula (1), it is possible to etch, with high selectivity, a silicon oxide film and/or a silicon nitride film relative to other films. Thus, in a multilayer structure including, for example, a silicon oxide film, a silicon nitride film, and/or a low-k film and having a pattern formed with a mask material, such as Poly-Si, ACL, or SiON, this gas composition can be employed for fine patterning for selectively etching the silicon oxide film and/or the silicon nitride film.

Plasma etching employing the hydrofluorocarbon gas composition of the invention solves conventional problems and issues, and has the following advantages.

(1) A silicon oxide film or a silicon nitride film is etched with high selectivity relative to a carbon-containing silicon-based film. Alternatively, a silicon oxide film and a silicon nitride film are etched simultaneously.

(2) Damage to mask materials, such as ACL, Poly-Si, and SiON, and to low dielectric constant materials, such as SiOC, caused by plasma etching can be reduced. Thus, impairment of device characteristics and reduction in yield can be prevented/suppressed.

In order to etch a silicon oxide film and/or a silicon nitride film with high selectivity relative to ACL, Poly-Si, SiON, or a carbon-containing silicon-based film, it has heretofore been necessary to mix a plurality of FC gases and/or HFC gases in accordance with the object to be etched, and control the mixing rate, etc. With the present invention, highly selective etching of a silicon oxide film or a silicon nitride film is achieved by employing a specific hydrofluorocarbon alone or as an etching gas composition including $O_2$ and/or Ar.

During plasma etching employing this etching composition, hydrogen atoms included in the specific hydrofluorocarbon and excessive fluorine radicals in the plasma react with one another and are discharged as HF, and thus, the etching of silicon film (crystalline silicon, amorphous silicon, polysilicon) can be prevented.

In a plasma using the specific hydrofluorocarbon etching gas composition, positive ions having 3 to 5 carbon atoms and also including fluorine atoms and hydrogen atoms, such as $C_3FH^+$, $C_3F_3H_2^+$, $C_4F_4H_2^+$, and $C_5F_5H_2^+$, are mainly produced; such ions are less likely to form a reactive layer on carbon-rich ACL or on a carbon-containing silicon-based film represented by SiC, SiOC, SiCN, SiOCN, or the like, and thus, etching is suppressed/prevented. In a silicon oxide film, etching proceeds because the oxygen in the silicon oxide film reacts with the carbon in the ions, to produce CO and $CO_2$. In a silicon nitride film, etching proceeds because the nitrogen in the silicon nitride film reacts with the hydrogen and carbon in the ions, to produce HCN and $NH_3$. Further, a plasma using the specific hydrofluorocarbon etching gas composition produces no $CF_3^+$, which is present in a $C_4F_6$ plasma. In general, $CF_3^+$ has a high etching rate but has low selectivity; thus, it is considered that a plasma using the specific hydrofluorocarbon etching gas composition, in which no $CF_3^+$ is produced, is suitable for selective etching.

In general, ions with a larger number of carbon atoms do not penetrate into an object-to-be-etched as deeply as ions having a smaller number of carbon atoms when implanted with the same energy, and can thus be expected to cause less damage to parts that are not to be etched, such as an undercoat film for etching.

The invention claimed is:

1. A dry etching method comprising a selective etching step wherein a multilayer structure including
   (a1) a carbon-containing silicon-based film, (a2) a crystalline silicon film, (a3) an amorphous silicon film, (a4) a polycrystalline silicon film (polysilicon film), (a5) a silicon oxynitride film, or (a6) an amorphous carbon film, and
   (b1) a silicon oxide film or (b2) a silicon nitride film
is subjected to plasma etching by using a gas composition for dry etching comprising a hydrofluorocarbon gas that has an unsaturated bond in its molecule and is represented by CxHyFz, wherein x is an integer of from 3 to 5, and relationships y+z≤2x and y≤z are satisfied, and thus selectively etching the silicon oxide film (b1) or the silicon nitride film (b2).

2. The dry etching method according to claim 1, wherein etching with the gas composition for dry etching is performed under a plasma condition in which the silicon oxide film (b1) and the silicon nitride film (b2) can be etched simultaneously.

3. The dry etching method according to claim 1, wherein etching of the silicon oxide film (b1) is performed selectively relative to the silicon nitride film (b2).

4. The dry etching method according to claim 1, wherein etching is performed by turning the gas composition for dry etching into plasma so that ions having 3 to 5 carbon atoms are produced.

5. The dry etching method according to claim 2, wherein etching is performed by turning the gas composition for dry etching into plasma so that ions having 3 to 5 carbon atoms are produced.

6. The dry etching method according to claim 3, wherein etching is performed by turning the gas composition for dry etching into plasma so that ions having 3 to 5 carbon atoms are produced.

7. A dry etching method comprising a selective etching step wherein a multilayer structure including
   (a1) a carbon-containing silicon-based film, (a2) a crystalline silicon film, (a3) an amorphous silicon film, (a4) a polycrystalline silicon film (polysilicon film), (a5) a silicon oxynitride film, or (a6) an amorphous carbon film, and
   (b1) a silicon oxide film or (b2) a silicon nitride film
is subjected to plasma etching by using the gas composition for dry etching comprising a hydrofluorocarbon gas that has an unsaturated bond in its molecule and is represented by CxHyFz, wherein x is an integer of from 3 to 5, and relationships y+z≤2x and y≤z are satisfied, said hydrofluorocarbon gas comprising 1,1,4,4-tetrafluoro-1,3-butadiene, and thus selectively etching the silicon oxide film (b1) or the silicon nitride film (b2).

8. The dry etching method according to claim 7, wherein the gas composition for dry etching includes, in addition to 1,1,4,4-tetrafluoro-1,3-butadiene, at least one compound selected from the group of oxygen-atom-containing compounds consisting of $O_2$, $O_3$, CO, $CO_2$, NO, $NO_2$, $SO_2$, and $SO_3$.

9. The dry etching method according to claim 7, wherein the gas composition for dry etching includes, in addition to 1,1,4,4-tetrafluoro-1,3-butadiene, at least one compound selected from the group of inert gases consisting of $N_2$, He, Ar, Ne, and Xe.

10. A dry etching method comprising a selective etching step wherein a multilayer structure including
    (a1) a carbon-containing silicon-based film, (a2) a crystalline silicon film, (a3) an amorphous silicon film, (a4) a polycrystalline silicon film (polysilicon film), (a5) a silicon oxynitride film, or (a6) an amorphous carbon film, and
    (b1) a silicon oxide film or (b2) a silicon nitride film
is subjected to plasma etching by using the gas composition for dry etching comprising a hydrofluorocarbon gas that has an unsaturated bond in its molecule and is represented by CxHyFz, wherein x is an integer of from 3 to 5, and relationships y+z≤2x and y≤z are satisfied, 1,1,4,4-tetrafluoro-1,3-butadiene being from 1 to 100 vol % of said hydrofluorocarbon gas, and thus selectively etching the silicon oxide film (b1) or the silicon nitride film (b2).

11. The dry etching method according to claim 10, wherein the gas composition for dry etching includes, in addition to 1,1,4,4-tetrafluoro-1,3-butadiene, at least one compound selected from the group of oxygen-atom-containing compounds consisting of $O_2$, $O_3$, CO, $CO_2$, NO, $NO_2$, $SO_2$, and $SO_3$.

12. The dry etching method according to claim 10, wherein the gas composition for dry etching includes, in addition to 1,1,4,4-tetrafluoro-1,3-butadiene, at least one compound selected from the group of inert gases consisting of $N_2$, He, Ar, Ne, and Xe.

13. The dry etching method according to claim 12, wherein etching is performed by turning the gas composition for dry etching into plasma so that ions having 3 to 5 carbon atoms are produced.

* * * * *